United States Patent
Schmausser et al.

(10) Patent No.: US 6,271,584 B1
(45) Date of Patent: *Aug. 7, 2001

(54) ARRANGEMENT OF ELECTRONIC COMPONENTS ON A BEARER STRIP

(75) Inventors: Stefan Schmausser, Ursensollen; Otto Gruber, Nittendorf; Siegfried Fischer, Maxhütte-Haidhof; Walter Juri, München; Bernd Barchmann, Regensburg; Jürgen Winterer, Nürnberg; Martin Petz, Hohenkammer; Jürgen Steinbichler, Brunn; Xaver Schlögel, Sachsenkam; Otto Voggenreiter, München, all of (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/913,724

(22) PCT Filed: Feb. 28, 1996

(86) PCT No.: PCT/DE96/00325
§ 371 Date: Aug. 27, 1997
§ 102(e) Date: Aug. 27, 1997

(87) PCT Pub. No.: WO96/27209
PCT Pub. Date: Sep. 6, 1996

(51) Int. Cl.⁷ .................. H01L 23/495; H01L 23/48; H01L 29/40; H01L 21/98
(52) U.S. Cl. .................. 257/699; 257/797; 257/694; 257/666; 257/668; 257/207; 257/773; 257/723; 257/701; 174/52.4; 206/329; 206/701; 206/725; 206/722

(58) Field of Search .................. 257/668, 685, 257/773, 723, 787, 701, 207, 691, 699, 797; 206/329, 701, 725, 722; 174/52.2

(56) References Cited

U.S. PATENT DOCUMENTS

| 5,023,202 | * | 6/1991 | Long et al. . | |
| 5,032,542 | | 7/1991 | Kazami et al. | 438/111 |
| 5,111,935 | * | 5/1992 | Bond et al. | 206/329 |
| 5,144,709 | * | 9/1992 | Rooney | 29/557 |
| 5,245,215 | | 9/1993 | Sawaya | 327/21 |
| 5,317,189 | | 5/1994 | Tsuji et al. | 257/694 |
| 5,473,196 | * | 12/1995 | De Givry | 257/773 |
| 5,477,085 | * | 12/1995 | Kose | 257/773 |
| 5,501,006 | * | 3/1996 | Gehman, Jr. et al. | 257/668 |
| 5,517,036 | * | 5/1996 | Semba et al. | 257/668 |
| 5,548,483 | * | 8/1996 | Feldman | 361/737 |
| 5,565,008 | * | 10/1996 | Shigetomo et al. | 29/25.01 |
| 5,637,916 | * | 6/1997 | Joshi | 257/685 |
| 5,772,038 | * | 6/1998 | Murata et al. | 206/725 |
| 5,869,353 | * | 2/1999 | Levy et al. | 438/109 |
| 5,892,280 | * | 4/1999 | Crane, Jr. et al. | 257/738 |
| 5,927,503 | * | 7/1999 | Nevill et al. | 206/701 |

FOREIGN PATENT DOCUMENTS

| 3 320 700 | 12/1984 | (DE) . | |
| 3 814 257 | 11/1988 | (DE) . | |
| 4 204 286 | 2/1992 | (DE) . | |
| 03 05 589 | 3/1989 | (EP) . | |
| 2634322 | * 1/1990 | (FR) | 257/685 |
| 2 678 428 | 12/1992 | (FR) . | |

* cited by examiner

Primary Examiner—Alexander O. Williams
(74) Attorney, Agent, or Firm—Schiff Hardin & Waite

(57) ABSTRACT

A bearer strip having components arranged in several parallel rows with variable spacing between the rows so as to increase packing density while providing sufficient empty space for introducing free flowing plastic on the bearer strip.

3 Claims, 1 Drawing Sheet

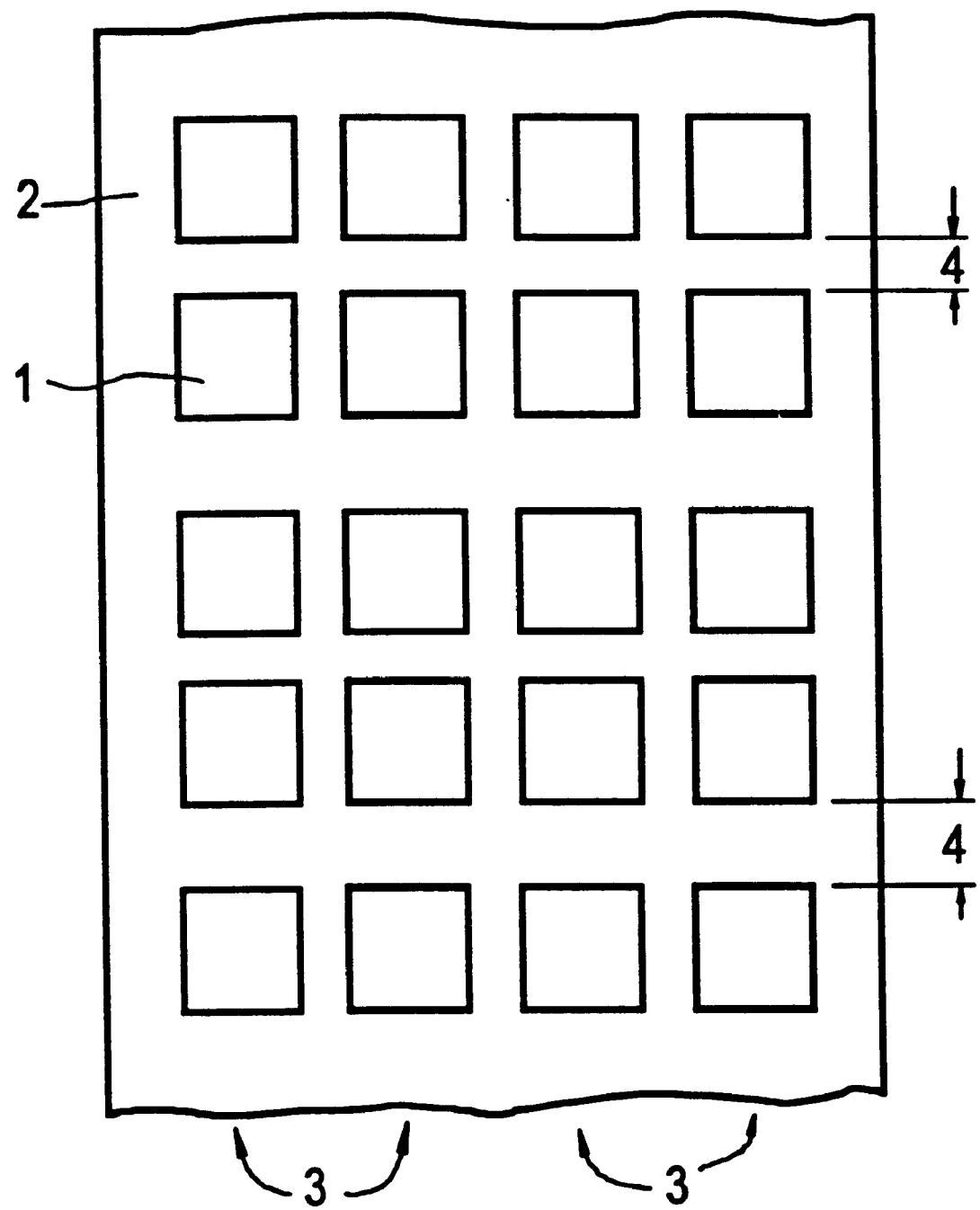

ARRANGEMENT OF ELECTRONIC COMPONENTS ON A BEARER STRIP

BACKGROUND OF THE INVENTION

The invention concerns an arrangement in the mounting of semiconductor components on a bearer strip, whereby the components are placed on the bearer strip in at least two parallel rows in the longitudinal direction and are provided with a covering or sheath made of plastic, which can be manufactured in a corresponding mold by means of the usually lateral supplying of free-flowing plastic molding material.

The manufacturing of semiconductor modules containing electronic components preferably ensues by mounting the electronic components on a bearer strip. There are a predetermined number of electronic components on this strip. With this bearer strip, the components are transported through the various processes for manufacturing the semiconductor modules. Meanwhile, due to increased demands on the packing density of the components on this bearer strip, i.e. for the increasing of the packing density, not only one component is assembled, electrically connected and extrusion-coated with plastic. Rather, several components are deposited one after the other in series on a bearer strip and are each correspondingly processed to form a semiconductor module. The next step in the increasing of the packing density is to arrange several such rows next to one another and to arrange them in parallel in the longitudinal direction on a bearer strip. Thus, in the first view corresponding to the multiplication of the components, a corresponding multiplication of the capacity on a bearer strip (e.g. a lead frame) could be manufactured. However, this presupposes a spacing between the individual components that remains the same. However, as a result of the method this encounters problems in the sheathing with a plastic (pressing compound) that is for example duroplastic. This step of the process provides the covering or sheathing of the arrangement of the individual components with the plastic, whereby this takes place in a corresponding mold, a cavity. As a rule, the free-flowing plastic is thereby guided from an outer edge of the bearer strip (lead frame) to the individual components. Since in the arrangement of the components with an increased packing density and several parallel rows of components are however to be reserved for the free-flowing plastic [sic], a faultless covering with plastic is no longer guaranteed for such arrangements.

The previous tendency in the manufacturing of semiconductor modules was to minimize the consumption of raw material in the lead frame and in the quantity of plastic. The currently existing consumption data are a general standard. In addition, the capacity of the molds in a production line is first of all limited in a production line without the production of new molds. In these regards, the minimization of the spacing between the components on a bearer strip has also been the declared aim of an economical production.

However, extraordinary advantages can be gained by a parallel arrangement of several rows of components.

SUMMARY OF THE INVENTION

The underlying aim of the invention is to provide an arrangement of electronic components on a bearer strip by means of which semiconductor modules as described above can be manufactured with good quality in a manufacturing process that essentially remains the same.

In an embodiment, the invention provides a device comprising a bearer strip having a predetermined number of electronic components arranged thereon in at least two parallel rows, wherein the components are separated by minimum spacing in a longitudinal direction of the bearer strip, the components being sufficiently separated to allow for the supply of a free flowing plastic molding compound onto a corresponding mold between adjacent components.

The invention is based on the knowledge that a qualitatively good covering or sheathing with plastic can be produced with the parallel arrangement of electronic components on a bearer strip, if an expansion of the spacing of the components, regarded in the longitudinal direction (pitch) is carried out. The enlargement of the spacing of the components is not uniform, but rather leads to different spacing, according to the placement of the components during the covering or, respectively, sheathing with a free-flowing plastic molding material. Since, as a rule, the plastic molding material is supplied laterally from an outer edge of a lead frame, for this supplying of molding compound a corresponding space requirement for the plastic has to be provided between the rows arranged in parallel and between the components themselves. In general, it can be said that the space requirement necessary for the supply of molding compound corresponds to the expansion or enlargement of the pitch.

These and other features of the invention are discussed in greater detail below in the following detailed description of the presently preferred embodiments with reference to the accompanying drawings.

BRIEF DESCRIPTION OF THE DRAWINGS

The sole FIGURE illustrates a segment of a bearer strip that can be employed in the invention.

DETAILED DESCRIPTION OF THE PRESENTLY PREFERRED EMBODIMENTS

In the following, an exemplary embodiment is specified on the basis of the accompanying schematic FIGURE.

The FIGURE schematically shows a segment of a bearer strip 2 with three parallel rows 3 of electronic components 1. The bearer strip 2 can be flexible, but as a rule is a lead frame in a stable embodiment. The parallel arrangement of the components on the lead frame is connected with the enlargement of the spacing 4 of the components 1 in the longitudinal direction. The longitudinal direction of the lead frame extends from top to bottom in the FIGURE. The optimal packing density cannot be achieved by this measure on a lead frame with a parallel arrangement of the components. However, as a whole the advantages that can be achieved from the arrangement shown in the figure of electronic components on a bearer strip or, respectively, lead frame outweigh the disadvantages.

To protect the components from environmental influences, a covering or, respectively, sheathing with plastic is necessary. This plastic (molding compound), generally duroplastic, requires corresponding ducts in order to flow to all the points of the arrangement. The partial enlargement of the spacing of the components, regarded in the longitudinal direction, thus helps ensure that the production step for the manufacture of a sheath from plastic can be executed with high quality. The space requirement hereby required for the supply of molding compound between the components arranged in parallel corresponds to the expansion or enlargement of the spacing 4 (pitch).

However, the expansion of the spacing 4 takes place only at those points at which it is genuinely necessary for the sheathing process. The standard of a constant spacing between the components is thereby abandoned, and a different spacing 4 is used.

The advantage of the parallel arrangement of components is substantial, but is reduced by various measures already named. This also includes the loss of capacity in molds that are limited in length.

In addition, an alternating spacing of the components 1, regarded in the longitudinal direction, is possible, so that the disadvantages due to an enlargement of the spacing 4 are limited to a minimum. This is indicated in the accompanying figure. The figure shows a bearer strip 2, which bears a total of four parallel rows 3 of electronic components 1. The rows 3 are arranged parallel to the longitudinal direction of the bearer strip 2. In a line of components 1, whereby the lines run perpendicular to the rows 3, in this view four electronic components 1 are respectively present. The spacing of the components 1 within a line is uniform. The spacing of the components 1 in the longitudinal direction, i.e. of two adjacent lines to one another, assumes various values. On the one hand, a sufficient space requirement for conducting a free-flowing plastic molding compound is desired. On the other hand, it should also be possible to process a maximal number of components 1 on a predetermined surface of a bearer strip 2, with respect to an extrusion coating in a mold. In order to reconcile these opposed features, the spacing 4 is realized in alternating fashion. In the figure, the spacing 4 is indicated twice on the right side of the bearer strip 2. The amount is thereby respectively different, whereby the lower amount is greater than the upper.

In this version, for example the lateral supplying of the plastic molding compound is arranged at the point of the larger spacing 4, so that plastic molding compound is introduced into every second spacing 4, and can distribute itself laterally into the smaller spacings in between.

Although modifications and changes may be suggested by those skilled in the art, it is the intention of the inventors to embody within the patent warranted hereon all changes and modifications as reasonably and properly come within the scope of their contribution to the art.

What is claimed is:

1. A device comprising:

a lead frame bearer strip having longitudinal and lateral directions and a predetermined number of electronic components arranged thereon in at least two parallel longitudinal rows in said longitudinal direction and in parallel lateral rows in said lateral direction;

wherein, components along any lateral row perpendicular to the longitudinal direction have the same spacing between them and components along the longitudinal direction have the same allocated spacing within which the components fit, the components have lateral and longitudinal edges and the components are arranged with their lateral edges aligned parallel to the longitudinal rows and longitudinal edges aligned parallel to the lateral rows, and the components are separated in the longitudinal direction of the bearer strip by alternating first and second spacings, and every second spacing between the components in the longitudinal direction is sufficiently larger than the first spacings to allow for the single-sided supply of free flowing plastic molding compound from a lateral side of the bearer strip onto a corresponding mold between adjacent components straddling said second spacing.

2. The device of claim 1, wherein the spacings between the components in the longitudinal direction of the bearer strip alternate between a plurality of dimensions.

3. A device comprising:

a lead frame bearer strip having lateral and longitudinal directions;

electronic components arranged essentially in a matrix on the bearer strip in at least two parallel longitudinal rows extending in the longitudinal direction and parallel lateral rows extending perpendicularly to the longitudinal direction;

the electronic components being separated from each other by alternating first and second spacing in the longitudinal direction, the second spacings in the longitudinal direction being larger than the first spacings, and every second spacing selected to be large enough to allow for single-sided delivery from a lateral side of said bearer strip of flowable plastic molding compound onto a corresponding mold between the components straddling said second spacing.

\* \* \* \* \*

UNITED STATES PATENT AND TRADEMARK OFFICE
CERTIFICATE OF CORRECTION

PATENT NO. : 6,271,584 B1
DATED : August 7, 2001
INVENTOR(S) : Schmausser et al.

It is certified that error appears in the above-identified patent and that said Letters Patent is hereby corrected as shown below:

<u>Title page,</u>
Below the PCT Pub. Date: Sep. 6, 1996 please add:

-- [30] Foreign Application Priority Data Mar. 1, 1995 [DE] Germany ...... 19507132.8 --

Signed and Sealed this

Twenty-sixth Day of November, 2002

*Attest:*

*Attesting Officer*

JAMES E. ROGAN
*Director of the United States Patent and Trademark Office*